(12) United States Patent
Sa et al.

(10) Patent No.: US 12,733,091 B2
(45) Date of Patent: Sep. 8, 2026

(54) STRETCHABLE SUBSTRATE, AND METHOD FOR MANUFACTURING STRETCHABLE SUBSTRATE

(71) Applicant: KOREA PHOTONICS TECHNOLOGY INSTITUTE, Gwangju (KR)

(72) Inventors: Gi Dong Sa, Gwangju (KR); Ja Yeon Kim, Gwangju (KR); Sa Ung Kim, Gwangju (KR); Ji Ho Jeong, Jeonju-si (KR); Eunbee Kim, Gwangju (KR)

(73) Assignee: Korea Photonics Technology Institute, Gwangju (KR)

(*) Notice: Subject to any disclaimer, the term of this patent is extended or adjusted under 35 U.S.C. 154(b) by 474 days.

(21) Appl. No.: 18/248,257

(22) PCT Filed: Nov. 20, 2020

(86) PCT No.: PCT/KR2020/016423
§ 371 (c)(1),
(2) Date: Apr. 7, 2023

(87) PCT Pub. No.: WO2022/075517
PCT Pub. Date: Apr. 14, 2022

(65) Prior Publication Data

US 2024/0008173 A1 Jan. 4, 2024

(30) Foreign Application Priority Data

Oct. 8, 2020 (KR) ........................ 10-2020-0130613

(51) Int. Cl.
*H05K 1/02* (2006.01)
*H05K 1/03* (2006.01)
(Continued)

(52) U.S. Cl.
CPC ......... *H05K 1/0283* (2013.01); *H05K 1/0346* (2013.01); *H05K 1/111* (2013.01);
(Continued)

(58) Field of Classification Search
CPC ...... H05K 1/111; H05K 3/005; H05K 1/0346; H05K 1/0283; H05K 1/028; H05K 1/1189; H05K 1/0277
See application file for complete search history.

(56) References Cited

U.S. PATENT DOCUMENTS 7,429,177 B2 * 9/2008 Li .......................... H05K 1/118 439/951
9,620,985 B2 * 4/2017 Rosenfeld ............... H02J 50/10
(Continued)

FOREIGN PATENT DOCUMENTS

JP 2002171033 A * 6/2002
KR 10-2005-0082451 A 8/2005
KR 10-2018-0118907 A 11/2018

OTHER PUBLICATIONS

Espacenet translation of JP2002171033A (Year: 2002).*
(Continued)

*Primary Examiner* — Timothy J Thompson
*Assistant Examiner* — Aditya Sharma
(74) *Attorney, Agent, or Firm* — You & IP, LLC

(57) ABSTRACT

A stretchable substrate and a manufacturing method of the stretchable substrate are disclosed. In a step of manufacturing a flexible substrate, a circuit pattern composed of one or more mounting pad parts configured to cause electronic parts to be mounted to a polyimide film PI having a fixed size is formed, and a wiring pattern configured to circuit-connect the mounting pad parts is formed, and further an outer circumferential line of the circuit pattern is realized in a cutting line for cutting. In a step of mounting parts, the
(Continued)

electronic parts are mounted on the circuit pattern of the flexible substrate. In a punching step for cutting the cutting line, a punching jig set to be aligned to the cutting line of the flexible substrate on which the parts are mounted is utilized, thereby realizing the excellent tensile performance of wiring configured to connect a circuit.

9 Claims, 5 Drawing Sheets

(51) Int. Cl.
*H05K 1/11* (2006.01)
*H05K 3/00* (2006.01)

(52) U.S. Cl.
CPC ..... *H05K 3/005* (2013.01); *H05K 2201/0154* (2013.01); *H05K 2201/09227* (2013.01); *H05K 2201/10037* (2013.01); *H05K 2201/10106* (2013.01); *H05K 2201/10545* (2013.01)

(56) References Cited

U.S. PATENT DOCUMENTS

| | | | | |
|---|---|---|---|---|
| 2005/0045374 | A1 * | 3/2005 | Kumar | H05K 1/118 174/254 |
| 2006/0225914 | A1 * | 10/2006 | Tan | H05K 1/028 174/257 |
| 2010/0330338 | A1 * | 12/2010 | Boyce | B29C 59/02 428/156 |
| 2015/0342050 | A1 * | 11/2015 | Jiang | H05K 1/181 361/749 |
| 2019/0067847 | A1 * | 2/2019 | Chuo | H01R 12/69 |
| 2020/0413533 | A1 * | 12/2020 | Majidi | H05K 1/189 |

OTHER PUBLICATIONS

J. Vanfleteren et al., Printed circuit board technology inspired stretchable circuits, MRS Bulletin, vol. 37, Issue 3: materials for stretchable electronics, Mar. 12, 2012, pp. 254-260.

Aftab M. Hussain et al., Ultrastretchable and Flexible Copper Interconnect-Based Smart Patch for Adaptive Thermotherapy, Advanced Health Care Materials, vol. 4, Issue 5, Dec. 3, 2014, pp. 1-9.

Yasser Khan et al., A New Frontier of Printed Electronics: Flexible Hybrid Electronics. Advanced Materials, vol. 32, Issue 15, Nov. 19, 2019, pp. 1-29.

Korean Office Action to the corresponding application KR10-2020-0130613.

* cited by examiner

FLEXIBLE SUBSTRATE (FPCB) ON WHICH THE CIRCUIT PATTERN IS FORMED

STRETCHABLE SUBSTRATE, AND METHOD FOR MANUFACTURING STRETCHABLE SUBSTRATE

TECHNICAL FIELD

The present invention relates to a stretchable substrate showing the excellent tensile performance of wiring configured to connect a circuit, and a method of manufacturing the stretchable substrate.

BACKGROUND ART

Recently, according to the vitalization of researches concerning devices attachable to the human body for bio and health care, wearable devices, stretchable displays, or the like, it has been required to develop a stretchable substrate having soft and durable properties without the occurrence of a breakdown, disconnection, or deformation of electronic parts or wiring in the inside in spite of bending and flexibility.

Accordingly, a conventional art has provided a flat polymer substrate composed of polydimethylsiloxane and so on, and has also provided a stretchable wiring substrate which is configured in such a manner that electronic parts are directly, electrically and mechanically mounted at each position where the electronic parts of a polymer or conductive polymer substrate are mounted using solder.

However, as previously described, in case that the electronic parts are directly attached to the polymer substrate using the solder, when the stretchable wiring substrate is bent or curved, bending or curving-based external force is directly transmitted to a bonding position between the polymer substrate and the electronic parts, so it could be problematic in that a crack occurs from wiring or the electronic parts, or the polymer substrate and the electronic parts are separated from each other.

Also, in the case of wiring using a metal line, although the wiring may be formed in such a manner as to attach the metal line to clothes by sewing it with thread, since a process therefor is complicated, and it costs much, there is a disadvantage in such a case in light of the fact that it is not suitable for mass production.

DETAILED DESCRIPTION OF THE INVENTION

Technical Problem

The present invention has been devised for solving the problems of the aforesaid conventional art, and an object of the present invention is to provide a stretchable substrate having higher softness and flexibility in such a manner as to apply a process of carrying out cutting treatment for the remaining section except the section of a circuit pattern after manufacturing a flexible substrate (a flexible printed circuit board, FPCB) to form the circuit pattern.

Also, the other object of the present invention is to provide a method of manufacturing a stretchable substrate which stretches excellently from side to side, and which provides a circuit with sufficient tensile strength in such a manner as to apply a wiring pattern having a structure in which left, right, upper, and lower portions are rotationally, symmetrically formed as well as having a characteristic of being bent softly as electronic parts are mounted to a flexible substrate (FPCB).

Solution for Solving the Problem

In order to solve the technical problems, a stretchable substrate according to one aspect of the present invention may comprise: a flexible substrate which is composed of a polyimide material having a fixed size, and on which a circuit pattern is formed; one or more mounting pad parts formed to cause electronic parts to be mounted to the flexible substrate; a wiring pattern configured to electrically connect any one mounting pad part (a first mounting pad part) and another mounting pad part (a second mounting pad part) which are adjacent to each other from the flexible substrate; and a hollow part formed to make a space vacant in such a manner as to perform cutting along an outer circumferential line of the circuit pattern composed of the mounting pad parts and the wiring pattern from the flexible substrate, wherein the wiring pattern is configured in such a shape that both end portions form a shape like Z in English character on the whole in between the first mounting pad part and the second mounting pad part, and each of both the end portions in the shape like Z in English character is bent and extends two times in different directions from each other in a streamline form, thereby being connected to each of the first mounting pad part and the second mounting pad part.

Also, the wiring pattern according to the present invention may be configured in a shape of comprising: a first curve portion which is curved at a fixed curvature radius by being connected to extend in a fixed length from a first connection point of any one mounting pad part; a second curve portion which is curved in the opposite direction by being formed rotationally, symmetrically with respect to the first curve portion; a first connection portion which extends to have a fixed length horizontally from the second curve portion; a third curve portion which is curved inward at a fixed curvature radius from an end of the first connection portion; a second connection portion which extends to have a fixed length in a diagonal direction with respect to a Z-like shape from the third curve portion; a fourth curve portion which is curved to be formed symmetrically with respect to the third curve portion from an end of the second connection portion; a third connection portion which extends to have a fixed length horizontally to be symmetrical with respect to the first connection portion from the fourth curve portion; a fifth curve portion which is curved at a fixed curvature radius to be symmetrical with respect to the second curve portion from an end of the third connection portion; a sixth curve portion which is curved by being formed rotationally, symmetrically with respect to the fifth curve portion, thereby finishing by being connected to a second connection point of another mounting pad part by extending to have a fixed length from the six curve portion, wherein the first curve portion and the second curve portion, and the fifth curve portion and the sixth curve portion are formed in each section having a shape resulting from being bent two times in different directions from each other in a streamline form, and the first connection portion, the second connection portion, and the third connection portion are bent at a fixed curvature radius, thereby being realized in a section form having a shape like a letter of the alphabet Z.

Also, the hollow part according to the present invention may be configured in such a manner as to cut the outer circumferential line set to be suitable for a position of the circuit pattern using a punching jig in which the blade for cutting the outer circumferential line of the circuit pattern is formed.

Also, the flexible substrate may be composed in a double-sided flexible printed circuit board (FPCB) type which shows that copper foil is formed to cause electronic parts to be mounted to a front surface and a back surface.

Also, light-emitting diode (LED) elements are installed in an array form on the mounting pad parts formed on the front surface of the flexible substrate according to the present invention, and the flexible substrate is composed of LED operation devices intended for making the LEDs work as the electronic parts operating based on Bluetooth low energy (BLE) and a battery are mounted to the mounting pad parts formed on the back surface.

Also, the battery according to the present invention may comprise battery array in which the plurality of batteries each disposed in the plurality of mounting pad parts are furnished.

In order to solve the technical problems, with respect to a method of manufacturing a stretchable substrate according to another aspect of the present invention, the method may comprise: a step of manufacturing a flexible substrate (a flexible printed circuit board, FPCB) to form a circuit pattern composed of one or more mounting pad parts configured to cause electronic parts to be mounted to a polyimide (PI) film having a fixed size, and a wiring pattern configured to circuit-connect the mounting pad parts; a step of mounting parts to mount the electronic parts assigned to the circuit pattern of the flexible substrate; and a punching step of carrying out work for cutting to form the remaining section expect the mounting pad parts and the wiring pattern in a hollow part by cutting the flexible substrate to which the parts are mounted using a punching jig. Here, the wiring pattern may be configured in such a shape that both end portions form a shape like a letter of the alphabet Z on the whole in between the first mounting pad part and the second mounting pad part which are adjacent to each other, and each of both the end portions in the shape like the letter of the alphabet Z is bent and extends two times in different directions from each other in a streamline form, thereby being connected to each of the first mounting pad part and the second mounting pad part.

Also, the wiring pattern according to the present invention may be configured in a shape of comprising: a first curve portion which is curved at a fixed curvature radius by being connected to extend in a fixed length from a first connection point of any one mounting pad part; a second curve portion which is curved in the opposite direction by being formed rotationally, symmetrically with respect to the first curve portion; a first connection portion which extends to have a fixed length horizontally from the second curve portion; a third curve portion which is curved inward at a fixed curvature radius from an end of the first connection portion; a second connection portion which extends to have a fixed length in a diagonal direction with respect to a Z-like shape from the third curve portion; a fourth curve portion which is curved to be formed symmetrically with respect to the third curve portion from an end of the second connection portion; a third connection portion which extends to have a fixed length horizontally to be symmetrical with respect to the first connection portion from the fourth curve portion; a fifth curve portion which is curved at a fixed curvature radius to be symmetrical with respect to the second curve portion from an end of the third connection portion; a sixth curve portion which is curved by being formed rotationally, symmetrically with respect to the fifth curve portion, thereby finishing by being connected to a second connection point of another mounting pad part by extending to have a fixed length from the six curve portion, wherein the first curve portion and the second curve portion, and the fifth curve portion and the sixth curve portion are formed in a shape resulting from being bent two times in different directions from each other in a streamline form, and the first connection portion, the second connection portion, and the third connection portion are realized in a form like a letter of the alphabet Z which is bent at a fixed curvature radius.

Also, an outer circumferential line of the circuit patterns according to the present invention may be composed in a cutting line for cutting, and the punching jig may be a processing implement manufactured for cutting the cutting line set to be suitable for a position of the circuit pattern in such a manner as to form the blade for cutting the cutting line of the circuit pattern.

In order to solve the technical problems, with respect to a method of manufacturing a stretchable substrate according to the other aspect of the present invention, the method may comprise: a step of manufacturing a flexible substrate (a flexible printed circuit substrate, FPCB), wherein a circuit pattern composed of one or more mounting pad parts configured to cause electronic parts to be mounted to a polyimide film PI having a fixed size, and a wiring pattern configured to circuit-connect the mounting pad parts is formed, and an outer circumferential line of the circuit pattern is realized in a cutting line for cutting; a punching step of cutting out the remaining section except the mounting pad parts and the wiring pattern in a hollow part by cutting the cutting line of the circuit pattern using a punching jig having the blade set to be suitable for the cutting line of the flexible substrate manufactured; and a step of mounting parts to mount the parts assigned to the mounting pad parts of the flexible substrate cut, thereby completing the stretchable substrate.

Effect of the Invention

The present invention according to the manufacturing method of the stretchable substrate described previously is advantageous in that since the wiring pattern is composed of a general flexible pattern in a simple diagonal form applied to the conventional art, or has a structure in which the whole portion has a Z-like shape, and a portion is twisted in a wave form like the head of a snake (or a snake form) having a shape resulting from being bent two times in a streamline form in comparison with shapes, such as a right-angled wave form, a zigzag form, a curved wave form, and a horseshoe-shaped wave form, the wiring pattern stretches primarily from the sections which are bent two times, and stretches from side to side secondarily from the Z-shaped section, so the stretching sections can become sufficiently longer, and excellent tensile strength can be provided.

Furthermore, it is effective to develop various electronic devices having higher softness and flexibility on the basis of the stretchable substrate manufactured by the manufacturing method of the stretchable substrate according to the present invention.

BEST MODE FOR CARRYING OUT THE INVENTION

Figure 1:
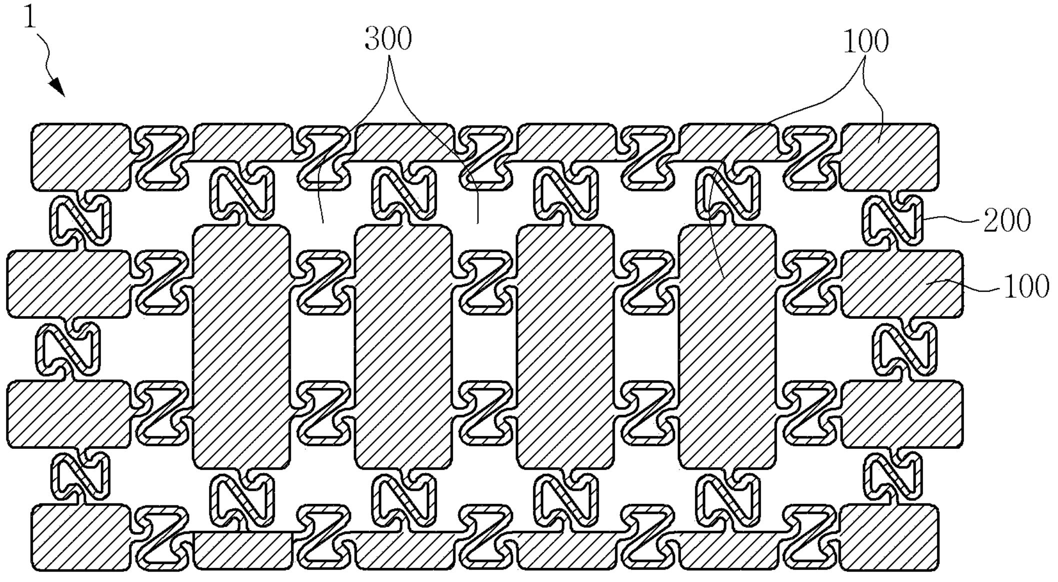
FIG. 1 is an exemplary view concerning a stretchable substrate manufactured according to one exemplary embodiment of the present invention.

A stretchable substrate according to one aspect of the present invention may comprise: a flexible substrate which is composed of a polyimide material having a fixed size, and on which a circuit pattern is formed; one or more mounting pad parts formed to cause electronic parts to be mounted to the flexible substrate; a wiring pattern configured to electrically connect any one mounting pad part (e.g., a first mounting pad part) and another mounting pad part (e.g., a second mounting pad part) located to be adjacent to each other from the flexible substrate; and a hollow part formed to make a space vacant in such a manner as to perform cutting along an outer circumferential line of the circuit pattern composed of the mounting pad parts and the wiring pattern from the flexible substrate, wherein the wiring pattern has a shape which shows that both end portions form a shape like Z in English character on the whole in between the first mounting pad part and the second mounting pad part, and each of both the end portions in the shape like Z in English character is bent and extend two times in different directions from each other in a streamline form, thereby being connected to each of the first mounting pad part and the second mounting pad part.

MODE FOR CARRYING OUT THE INVENTION

The terms or words used in the present description and claims should not be construed as being limited to meanings defined in a dictionary, but should be construed as having meanings and concepts which are coincident with the technical ideas of the present invention on the basis of the principle that the inventors can appropriately define concepts of the terms for describing their invention in the best mode.

Accordingly, since the exemplary embodiments described in the present specification, and the constitutions illustrated in the drawings, which are just examples, shouldn't be regarded as completely representing the technical ideas of the present invention, it should be understood that there could be various equivalents and modification examples which could replace them at the time of filing.

Hereinafter, the preferable exemplary embodiments of the present invention are described in detail with reference to the accompanying drawings.

FIG. 1, which is an exemplary view concerning a stretchable substrate according to one exemplary embodiment of the present invention, shows the stretchable substrate completed in such a manner as to perform cutting using a punching jig.

As illustrated therein, the stretchable substrate 1 according to the present invention comprises: a flexible substrate which is composed of a polyimide material having a fixed size, and on which a circuit pattern is formed; one or more mounting pad parts 100 formed to cause electronic parts to be mounted to the flexible substrate; a wiring pattern 200 which is formed by a section having such a shape that each of both portions adjacent to both the mounting pad parts 100 is bent two times in different directions from each other in a streamline form to electrically connect any one mounting pad part 100 and another mounting pad part 100 to each other from the flexible substrate, and which is formed in such a manner as to connect a middle portion located in the center so as to have a section having a shape like a letter of the alphabet Z; and a hollow part 300 which is formed to make a space vacant in such a manner as to perform cutting along an outer circumferential line of the circuit pattern 200 composed of the mounting pad parts 100 and the wiring pattern from the flexible substrate.

In order to manufacture this stretchable substrate 1, according to the present invention, the stretchable substrate is embodied using a manufacturing method as follows.

Figure 2:
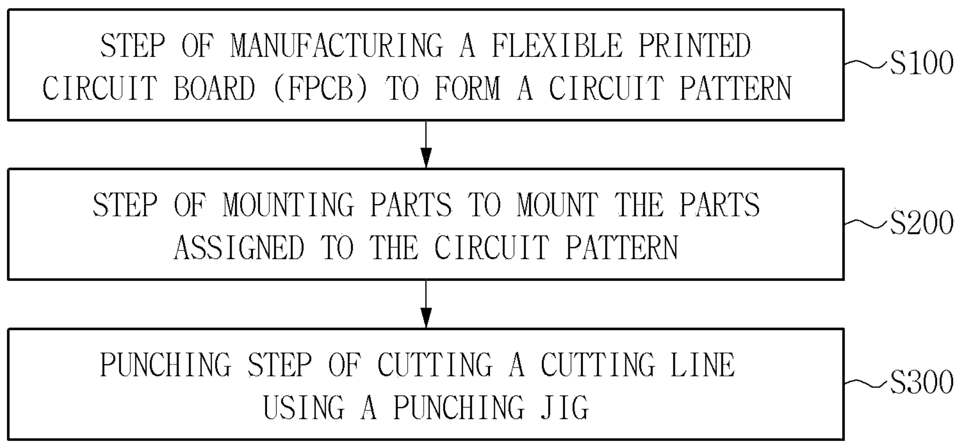
FIG. 2 is a flow chart concerning a method of manufacturing a stretchable substrate according to a first exemplary embodiment of the present invention.
Figure 3:
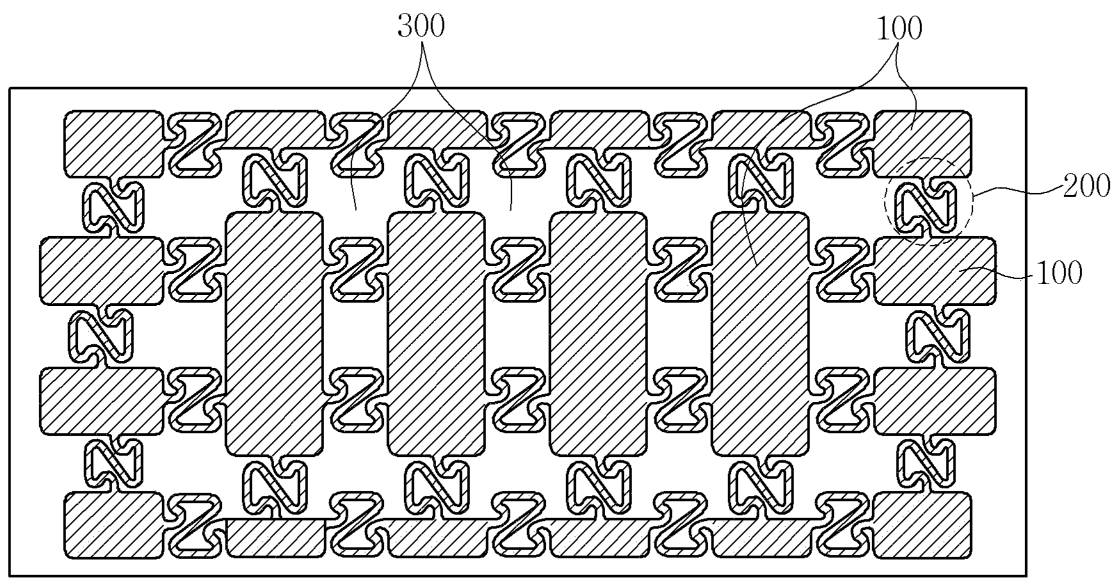
FIG. 3 is an exemplary view concerning a flexible substrate on which a circuit pattern is formed according to the present invention.

Thus, FIG. 2 is a flow chart concerning a method of manufacturing a stretchable substrate according to a first exemplary embodiment of the present invention, and FIG. 3 is an exemplary view concerning a flexible substrate on which a circuit pattern is formed according to the present invention.

As shown in FIG. 2, a method of manufacturing the stretchable substrate according to the first exemplary embodiment of the present invention may comprise: a step of manufacturing a flexible substrate (i.e., a flexible printed circuit board) S100; a step of mounting parts S200; and a punching step of performing cutting along a cutting line of the flexible substrate S300.

To explain this, the step S100 of manufacturing the flexible substrate represents a step of manufacturing a flexible printed circuit board (FPCB) capable of functioning as an electric circuit by forming a circuit pattern in a base film cut out in a fixed size.

At this time, the base film may be composed of a polyimide (PI) material which is a ductile material having an excellent electrical characteristic and thermal stability. Thus, the base film may flexibly be bent due to its characteristic of having a bending property.

Here, the circuit pattern formed on the flexible substrate may be realized in a structure of a large number of the mounting pad parts 100 to which one or more electronic parts are mounted, and the wiring pattern 200 configured to circuit-connect the mounting pad parts 100.

At this time, the mounting pad part 100 may be composed in a single-sided FPCB type which shows that copper foil is formed on only a front surface of the base film, and a double-sided FPCB type which shows that copper foil is formed to cause electronic parts to be mounted to front and back surfaces. The description about a detailed process of forming the circuit pattern with respect to this flexible substrate (i.e., a flexible printed circuit substrate) is omitted because the process is a publicly-known technology.

However, with respect to the circuit pattern according to the present invention, the outer circumferential line of the mounting pad parts 100 and the wiring pattern 200 is realized in a cutting line for cutting, and the cutting line is intended for performing cutting so that the outer circumferential line of the mounting pad parts 100 and the wiring pattern can be cut using the blade, or a punching jig.

FIG. 3 shows an example concerning the FPCB manufactured through the steps of manufacturing the flexible substrate. Furthermore, FIG. 4 is an enlargement view concerning the wiring pattern formed by the step S100 of manufacturing the flexible substrate according to the present invention.

Figure 4:
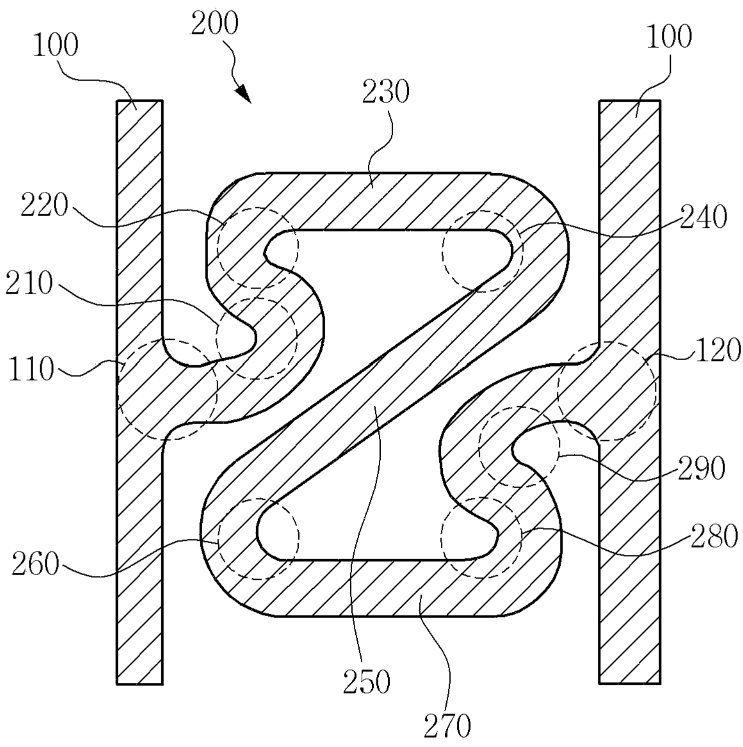
FIG. 4 is an enlargement view concerning a wiring pattern according to the present invention.

That is, in order to realize flexibility and excellent tensile performance, the stretchable substrate 1 manufactured according to the present invention is configured in such a manner that the specific wiring pattern 200 having the structure as shown in FIG. 4 is equally repeated in each circuit connection line of the mounting pat-parts 100.

Thus, the wiring pattern 200 according to the present invention is described in detail with reference to FIG. 4 as follows.

The wiring pattern 200 according to the present invention has a first curve portion 210 which is bent at a fixed curvature radius by being connected at a first connection point 110 of any one mounting pad part 100. Although the first curve portion 210 is formed to be bent upward as illustrated, no initial direction of the first curve portion 210 is tied to any specific direction of the upper direction or the lower direction as the first curve portion is connected by being bent downward as shown in a second connection point 120 located in the opposite direction.

Then, as the curvature radius is rotationally, symmetrically formed at the first curve portion 210, a second curve portion 220 connected while being bent in the opposite direction is formed.

That is, as length extends from the mounting-pad part located in any one side, the first curve portion 210 and the second curve portion 220, which are curved in a form of being bent two times in the upper and lower directions in a streamline form, are formed.

Next, a first connection portion 230 is formed to extend in a fixed length horizontally from the second curve portion 220.

Furthermore, a third curve portion 240 is formed to be curved inward at a fixed curvature radius from an end of the first connection portion 230.

Next, from the third curve portion 240, a second connection portion 250, which extends to have a fixed length diagonally in between both the mounting pad parts 100, is formed.

Next, a fourth curve portion 260, which is curved outward from an end of the second connection portion 250, being curved by being formed symmetrically with respect to the third curve portion 240 in a diagonal direction as illustrated, is formed.

Furthermore, a third connection portion 270, which extends to have a fixed length symmetrically and horizontally with respect to the first connection portion 230 in the upper direction from the fourth curve portion 260, is formed.

This first connection part 230, the second connection 250 in a diagonal line, and the third connection portion 270 may be seen in a shape like Z which is curved to have a fixed curvature radius.

A fifth curve portion 280, which is curved at a fixed curvature radius diagonally and symmetrically with respect to the second curve portion 220 from an end of the third connection portion 270, is formed, and a sixth curve portion 290, which is connected while being curved in the opposite direction by being formed rotationally, symmetrically with respect to the fifth curve portion 280, is formed.

Here, it may be found that the fifth curve portion 280 and the sixth curve portion 290 have a shape of being bent two times in a bending form in different directions from each other in the same shape by being symmetrical with respect to the first curve portion 210 and the second curve portion 220 in a diagonal direction.

In conclusion, since the sixth curve portion 290 is connected to the second connection point 120 of any one mounting pad part 100 by extending lengthwise, the wiring pattern 200 according to the present invention is completed to connect both the mounting pad parts to each other.

That is, the wiring pattern 200 according to the present invention has the structure in which the left and right, and upper and lower portions are symmetrically formed, the structure in which a portion has the shape of being bent two times in the different directions from each other in a streamline form, and a specific portion in the center is twisted in a wave form like the head of a snake (or a snake form) having a shape like Z.

In comparison with conventional shapes, like a general form in which a flexible section in the center has a simple diagonal line form, a right-angled wave form, a zigzag form, a curve wave form, and a horseshoe-shaped wave form, this structure of the wiring pattern 200 is effective to cause the wiring pattern to be stretchable primarily from each section of the first curve portion 210, the second curve portion 220, the fifth curve portion 280, and the sixth curve portion 290 corresponding to twisted portions of the wiring pattern 200 which is bent two times in the streamline form, and to cause the wiring pattern to be more stretchable from side to side secondarily from a Z-shaped section composed of the first connection portion 230, the second connection portion 250 and the third connection portion 270, and the structure is also advantageous in that sufficient tensile strength can be provided in the left and right sides.

Thus, the step S200 of mounting the parts to mount the electronic parts assigned to a surface of the flexible substrate (FPCB) previously manufactured according to one exemplary embodiment of the present invention is carried out. Since this is the general process of a surface mounted technology (SMT), the detailed description thereof is omitted.

Next, the punching step S300 represents a step of cutting the cutting line using a punching jig which is suitable for the flexible substrate to which the parts are mounted.

Figure 5:
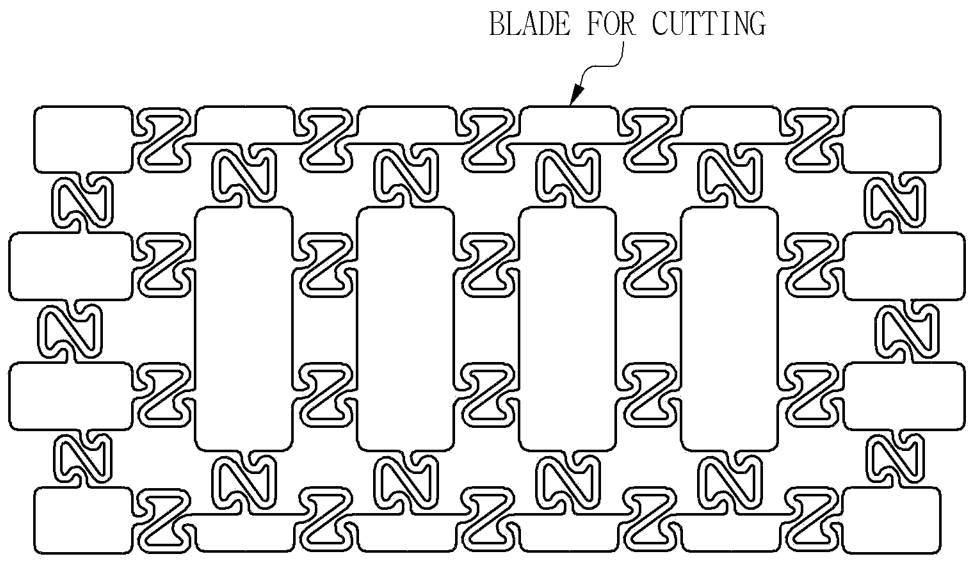
FIG. 5 is an exemplary view showing a punching jig manufactured for cutting the flexible substrate formed as shown in FIG. 3.

Accordingly, FIG. 5 is an exemplary view concerning the punching jig manufactured for cutting the flexible substrate formed as shown in FIG. 3.

In general, the jig may represent a processing device having a minimum of function of guiding a tool while functioning to aim at, seize, and fix an object to be processed, and the punching jig as illustrated may be a processing implement manufactured for cutting the outer circumferential line (the cutting line) of the flexible substrate in such a manner as to form the blade intended for carrying out cutting (punching) to be suitable for the outer circumferential line (the cutting line) of the mounting pad parts and the wiring pattern 200.

Thus, the punching step S300 may be a step of carrying out work of cutting out the cutting line to form the hollow part 300 to make a space except the mounting pad parts 100 and the wiring pattern 200 vacant by cutting (punching) the cutting line using the punching jig in a state of putting the cutting line of the flexible substrate to which the parts are mounted on the blade intended for cutting.

The hollow part 300 which is hollow by cutting through the punching step S300, the mounting pad parts 100 to which the parts are mounted, and the wiring pattern 200 only remain through the punching step S300, so the stretchable substrate 1 is finally completed.

Accordingly, FIG. 1 is an exemplary view concerning the stretchable substrate completed in such a manner as to cut the flexible substrate shown in FIG. 3 using the punching jig shown in FIG. 5, and the stretchable substrate completed as shown in FIG. 1 has a form of being divided into the mounting pad parts 100, the wiring pattern 200, and the hollow part 300 corresponding to the cut space.

Figure 6:
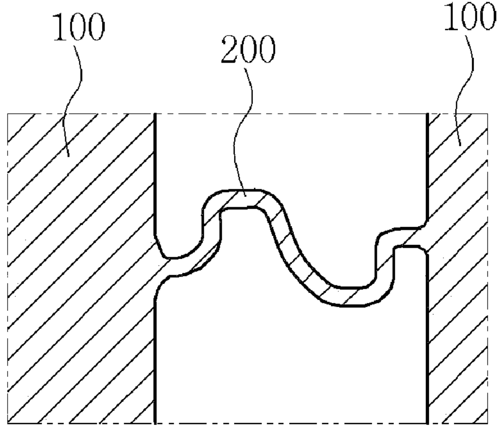
FIG. 6 is an exemplary view showing a test for tensile performance of the stretchable substrate completed according to the present invention.

FIG. 6, which is an exemplary view showing a test for tensile performance of the stretchable substrate 1 completed according to the present invention, represents a state which shows that the wiring pattern stretches efficiently in between both the mounting pad parts 100.

Thus, in comparison with the conventional stretchable substrate, the stretchable substrate 1 according to the present invention shows that stretchable sections increase because the sections of the first curve portion 210, the second curve portion 220, the fifth curve portion 280, and the sixth curve portion 290 which are bent two times in the streamline form, and the Z-shaped section composed by the first connection portion 230, the second connection portion 250, and the third connection portion 270 have a characteristic of stretching doubly, and it may be found that efficient tensile performance can be displayed.

Also, with respect to order of the manufacturing method of the stretchable substrate, unlike the process according to the first exemplary embodiment comprising: the step of manufacturing the flexible substrate (FPCB) S100; the step of mounting the parts S200; and the punching step of cutting the cutting line of the flexible substrate S300, the present invention may be embodied in a second exemplary embodiment comprising: a step of manufacturing a flexible substrate (FPCB) S100; a punching step of cutting a cutting line of the flexible substrate S300; and a step of mounting parts to mount the parts assigned to the mounting pad parts S200.

Figure 7:
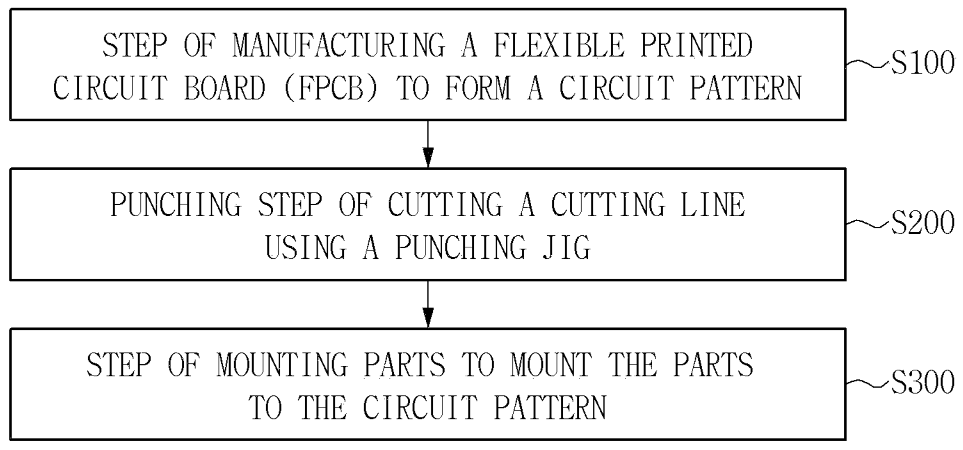
FIG. 7 is a flow chart concerning a method of manufacturing a stretchable substrate according to a second exemplary embodiment of the present invention.

Thus, FIG. 7, which is a flow chart concerning the method of manufacturing the stretchable substrate according to the second exemplary embodiment of the present invention, shows carrying out the punching step S300 of cutting the cutting line of the flexible substrate in advance after carrying out the step S100 of manufacturing the flexible substrate (FPCB), and then carrying out the step S200 of mounting the parts to mount the parts assigned to the mounting pad parts. At this time, a detailed basic process carried out according to each step, and a shape of the wiring pattern are same as those aforesaid through the first exemplary embodiment.

Figure 8:
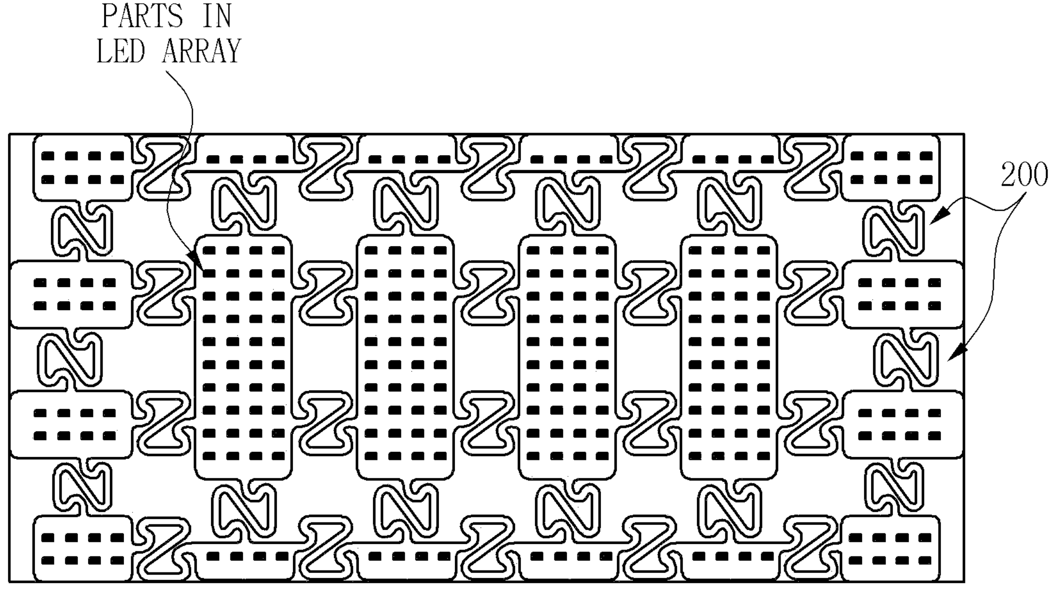
FIG. 8 is a plane view concerning a light-emitting diode (LED) circuit board in which parts are mounted to the stretchable substrate completed according to the first exemplary embodiment or the second exemplary embodiment.
Figure 9:
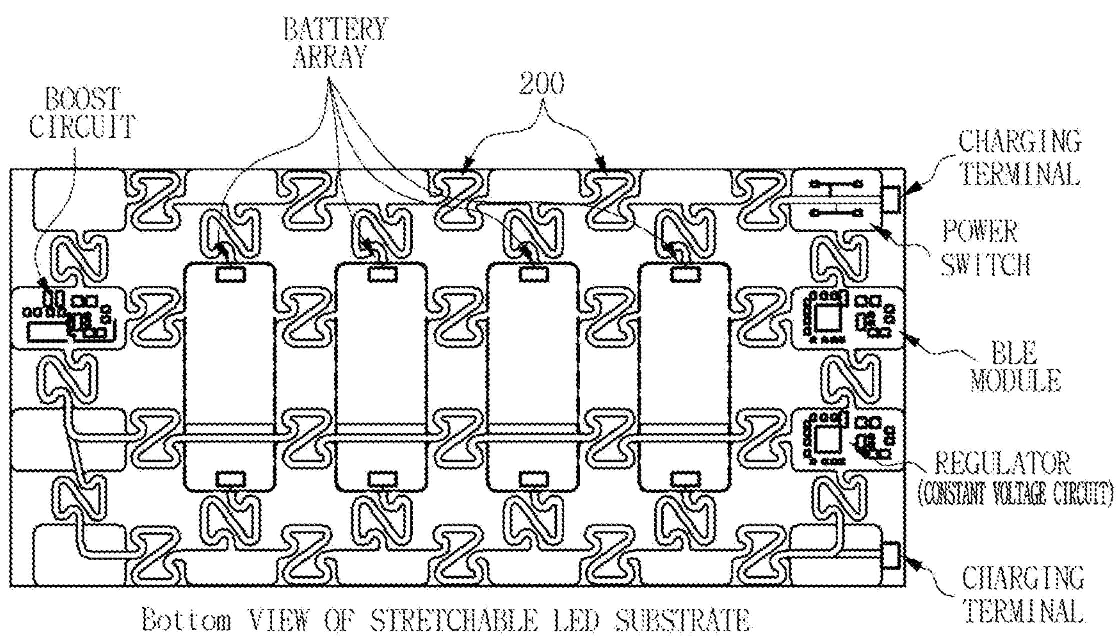
FIG. 9 is a bottom view concerning FIG. 8.

FIG. 8 is a plane view concerning a light-emitting diode (LED) circuit board in which parts are mounted to the stretchable substrate completed according to the first exemplary embodiment or the second exemplary embodiment of the present invention, and FIG. 9 is a bottom view concerning FIG. 8.

As shown in FIG. 8 and FIG. 9, LED elements are mounted in an array form to the mounting pad parts formed on a front surface of the flexible substrate through the first exemplary embodiment or the second exemplary embodiment, and electronic parts operating based on Bluetooth low energy (BLE), batteries, other power switches, constant voltage circuits, boost circuits are mounted to the mounting pad parts formed on a back surface, so the stretchable LED substrate composed of LED operation devices intended for making the LED work can be provided.

The stretchable LED substrate manufactured by the manufacturing method of the stretchable substrate according to the present invention may cause the LEDs or relevant electronic parts mounted to the mounting pad parts of the flexible substrate (FPCB) to be bent more flexibly, and thanks to the wave structure of the wiring pattern 200 intended for connecting the mounting pad parts 100, which has a form like the head of a snail, the stretchable LED substrate may enable the emission of light from the LEDs while operating as a stretchable device capable of causing stretching sections to increase, and displaying efficient tensile performance.

Figure 10:
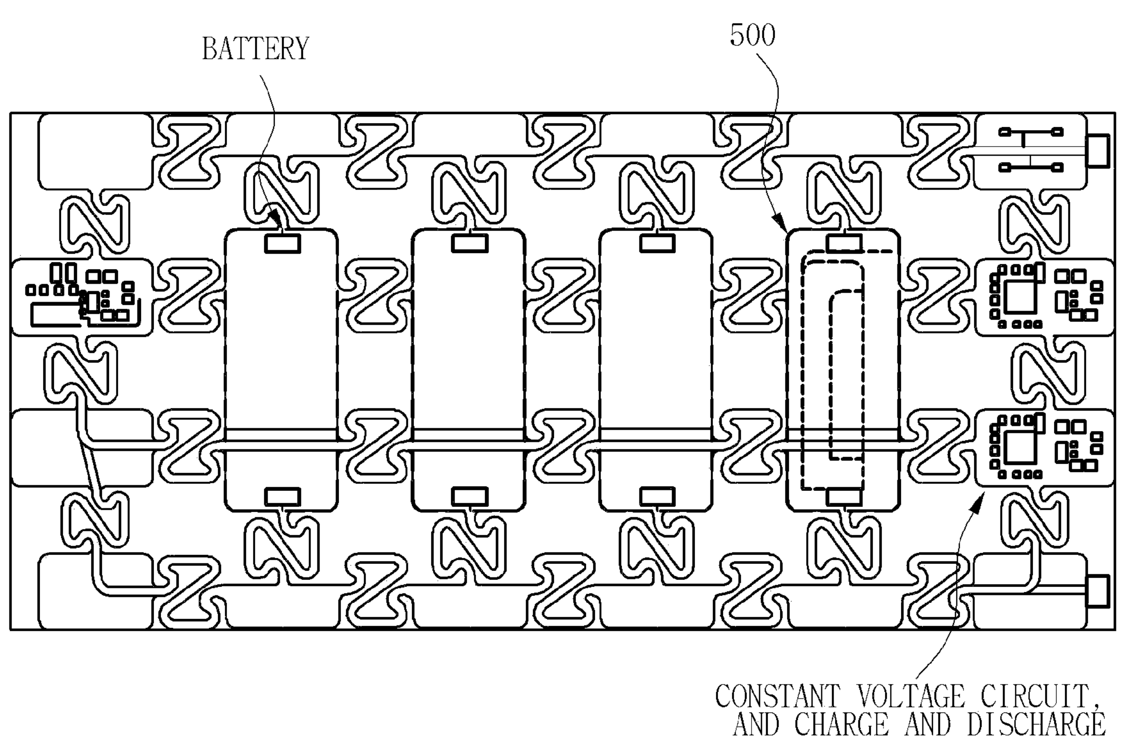
FIG. 10 is a schematic view for explaining a stretchable substrate according to the other exemplary embodiment of the present invention.

FIG. 10 is a schematic view for explaining a stretchable substrate according to the other exemplary embodiment of the present invention.

Referring to FIG. 10, with respect to the stretchable substrate according to the present exemplary embodiment, a coil 500 (a secondary coil) configured to receive wireless power may be furnished in any one of the mounting pad parts formed on the front surface or the back surface of the flexible substrate, or the plurality of mounting pad parts. The coil 500 may receive the wireless power from the outside by being connected to a battery via a charge and discharge control circuit, thereby being configured to cause the battery to be charged. In this case, the charge and discharge control circuit may comprise a conversion circuit configured to convert energy abandoned from the coil 500 into power which can give a charge of electricity to the battery, or may have it separately.

Also, the charge and discharge control circuit may control each charge and discharge of the batteries in the battery array individually or totally, and may operate so as to secure the stability of battery work and the life span of the batteries by controlling each charge and discharge of the batteries according to the state of charge (SOC) of each battery.

As previously described, although the preferable exemplary embodiments have been described in the detailed description of the present invention, it is to be understood that modifications and alternations of the present invention can variously be made by those having ordinary skill in the technical field to which the present invention pertains without deviating from the idea and the scope of the present invention described in the following claims.

What is claimed is:

1. A stretchable substrate, comprising:

a flexible substrate which is composed of a polyimide material having a fixed size, and on which a circuit pattern is formed;

one or more mounting pad parts formed to cause electronic parts to be mounted to the flexible substrate;

a wiring pattern configured to electrically connect a first mounting pad part and a second mounting pad part which are adjacent to each other from the flexible substrate; and a hollow part formed to make a space vacant in such a manner as to perform cutting along an outer circumferential line of the circuit pattern composed of the mounting pad parts and the wiring pattern from the flexible substrate, wherein the wiring pattern is configured in such a shape that both end portions form a shape like the Arabic numeral 2 on the whole in between the first mounting pad part and the second mounting pad part, and each of both the end portions in the shape like the Arabic numeral 2 is bent and extends two times in different directions from each other in a streamline form, thereby being connected to each of the first mounting pad part and the second mounting pad part, wherein the wiring pattern is configured in a shape of comprising:

a first curve portion which is curved at a fixed curvature radius by being connected to extend in a fixed length from a first connection point of any one mounting pad part;

a second curve portion which is curved in the opposite direction by being formed rotationally, symmetrically with respect to the first curve portion;

a first connection portion which extends to have a fixed length horizontally from the second curve portion;

a third curve portion which is curved inward at a fixed curvature radius from an end of the first connection portion;

a second connection portion which extends to have a fixed length in a diagonal direction with respect to a Z-like shape from the third curve portion;

a fourth curve portion which is curved to be formed symmetrically with respect to the third curve portion from an end of the second connection portion;

a third connection portion which extends to have a fixed length horizontally to be symmetrical with respect to the first connection portion from the fourth curve portion;

a fifth curve portion which is curved at a fixed curvature radius to be symmetrical with respect to the second curve portion from an end of the third connection portion; and a sixth curve portion which is curved by being formed rotationally, symmetrically with respect to the fifth curve portion, thereby finishing by being connected to a second connection point of another mounting pad part by extending to have a fixed length from the six curve portion, wherein the first curve portion and the second curve portion, and the fifth curve portion and the sixth curve portion are curved in a shape resulting from being bent two times in different directions from each other in a streamline form, and the first connection portion, the second connection portion, and the third connection portion are bent at a fixed curvature radius, thereby being realized in a section form having a shape like a letter of the alphabet Z, or the Arabic numeral 2.

2. The stretchable substrate of claim 1, wherein the hollow part is configured in such a manner as to cut the outer circumferential line set to be suitable for a position of the circuit pattern using a punching jig in which the blade for cutting the outer circumferential line of the circuit pattern is formed.

3. The stretchable substrate of claim 1, wherein the flexible substrate is composed in a double-sided flexible printed circuit board (FPCB) type which shows that copper foil is formed to cause electronic parts to be mounted to a front surface and a back surface.

4. The stretchable substrate of claim 1, wherein a coil configured to receive wireless power is included in any one of the mounting pad parts or the plurality of mounting pad parts located on the front surface or the back surface of the flexible substrate.

5. The stretchable substrate of claim 3, wherein light-emitting diode (LED) elements are installed in an array form on the mounting pad parts formed on the front surface of the flexible substrate, and the flexible substrate is composed of LED operation devices intended for making the LEDs work as the electronic parts operating based on Bluetooth low energy (BLE) and a battery are mounted to the mounting pad parts formed on the back surface, wherein the battery comprises battery array in which the plurality of batteries each disposed in the plurality of mounting pad parts are furnished.

6. The stretchable substrate of claim 4, wherein light-emitting diode (LED) elements are installed in an array form on the mounting pad parts formed on the front surface of the flexible substrate, and the flexible substrate is composed of LED operation devices intended for making the LEDs work as the electronic parts operating based on Bluetooth low energy (BLE) and a battery are mounted to the mounting pad parts formed on the back surface, wherein the battery comprises battery array in which the plurality of batteries each disposed in the plurality of mounting pad parts are furnished.

7. A method of manufacturing a stretchable substrate, the method comprising:

a step of manufacturing a flexible substrate (a flexible printed circuit board, FPCB) to form one or more mounting pad parts configured to cause electronic parts to be mounted to a polyimide (PI) film having a fixed size, and a circuit pattern configured to circuit-connect the mounting pad parts, wherein the wiring pattern has a shape which shows that both end portion forms a shape like a letter of the alphabet Z on the whole in between a first mounting pad part and a second mounting pad part, and each of both the end portions in the shape of the letter of the alphabet Z is bent and extends two times in different directions from each other in a streamline form, thereby being connected to each of the first mounting pad part and the second mounting pad part;

a step of mounting parts to mount the electronic parts assigned to the circuit pattern of the flexible substrate; and a punching step of carrying out work for cutting out the remaining section expect the mounting pad parts and the wiring pattern in a hollow part by cutting the flexible substrate to which the parts are mounted using a punching jig, wherein the wiring pattern is configured in a shape of comprising:

a first curve portion which is curved at a fixed curvature radius by being connected to extend in a fixed length from a first connection point of any one mounting pad part;

a second curve portion which is curved in the opposite direction by being formed rotationally, symmetrically with respect to the first curve portion;

a first connection portion which extends to have a fixed length horizontally from the second curve portion;

a third curve portion which is curved inward at a fixed curvature radius from an end of the first connection portion;

a second connection portion which extends to have a fixed length in a diagonal direction with respect to a Z-like shape from the third curve portion;

a fourth curve portion which is curved to be formed symmetrically with respect to the third curve portion from an end of the second connection portion;

a third connection portion which extends to have a fixed length horizontally to be symmetrical with respect to the first connection portion from the fourth curve portion;

a fifth curve portion which is curved at a fixed curvature radius to be symmetrical with respect to the second curve portion from an end of the third connection portion; and a sixth curve portion which is curved by being formed rotationally, symmetrically with respect to the fifth curve portion, thereby finishing by being connected to a second connection point of another mounting pad part by extending to have a fixed length from the six curve portion, wherein the first curve portion and the second curve portion, and the fifth curve portion and the sixth curve portion are curved in a shape resulting from being bent two times in different directions from each other in a streamline form, and the first connection portion, the second connection portion, and the third connection portion are realized in a shape like Z which is bent at a fixed curvature radius.

8. The method of claim 7, wherein an outer circumferential line of the circuit patterns is composed in a cutting line for cutting, and the punching jig is a processing implement manufactured for cutting the cutting line set to be suitable for a position of the circuit pattern in such a manner as to form the blade for cutting the cutting line of the circuit pattern.

9. A method of manufacturing a stretchable substrate, the method comprising:

a step of manufacturing a flexible substrate (a flexible printed circuit substrate, FPCB), wherein a circuit pattern composed of one or more mounting pad parts configured to cause electronic parts to be mounted to a polyimide film PI having a fixed size, and a wiring pattern configured to circuit-connect the mounting pad parts is formed, and an outer circumferential line of the circuit pattern is realized in a cutting line for cutting;

a punching step of cutting out the remaining section except the mounting pad parts and the wiring pattern in a hollow part by cutting the cutting line of the circuit pattern using a punching jig having the blade set to be suitable for the cutting line of the flexible substrate manufactured; and a step of mounting parts to mount the parts assigned to the mounting pad parts of the flexible substrate cut, thereby completing the stretchable substrate, wherein the wiring pattern is configured in a shape of comprising:

a first curve portion which is curved at a fixed curvature radius by being connected to extend in a fixed length from a first connection point of any one mounting pad part;

a second curve portion which is curved in the opposite direction by being formed rotationally, symmetrically with respect to the first curve portion;

a first connection portion which extends to have a fixed length horizontally from the second curve portion;

a third curve portion which is curved inward at a fixed curvature radius from an end of the first connection portion;

a second connection portion which extends to have a fixed length in a diagonal direction with respect to a Z-like shape from the third curve portion;

a fourth curve portion which is curved to be formed symmetrically with respect to the third curve portion from an end of the second connection portion;

a third connection portion which extends to have a fixed length horizontally to be symmetrical with respect to the first connection portion from the fourth curve portion;

a fifth curve portion which is curved at a fixed curvature radius to be symmetrical with respect to the second curve portion from an end of the third connection portion; and a sixth curve portion which is curved by being formed rotationally, symmetrically with respect to the fifth curve portion, thereby finishing by being connected to a second connection point of another mounting pad part by extending to have a fixed length from the six curve portion, wherein the first curve portion and the second curve portion, and the fifth curve portion and the sixth curve portion are curved in a shape resulting from being bent two times in different directions from each other in a streamline form, and the first connection portion, the second connection portion, and the third connection portion are realized in a shape like a letter of the alphabet Z which is bent at a fixed curvature radius.

* * * * *